(12) United States Patent
Sternowski

(10) Patent No.: US 6,297,758 B1
(45) Date of Patent: Oct. 2, 2001

(54) ELECTROOPTICAL SCANNING ANALOG-TO-DIGITAL CONVERTER

(75) Inventor: Robert H. Sternowski, Cedar Rapids, IA (US)

(73) Assignee: Rockwell Collins, Cedar Rapids, IA (US)

(*) Notice: Subject to any disclaimer, the term of this patent is extended or adjusted under 35 U.S.C. 154(b) by 0 days.

(21) Appl. No.: 09/392,862

(22) Filed: Sep. 9, 1999

(51) Int. Cl.$^7$ .................................................. H03M 1/20
(52) U.S. Cl. .................... 341/137; 341/131; 341/155; 341/138; 341/110; 341/135; 341/13; 350/96.13; 350/96.14; 350/96.12; 364/574; 385/12; 385/24; 385/37; 385/40; 385/122; 359/123; 359/184; 359/185; 359/124; 359/181; 359/121; 250/227
(58) Field of Search .................................. 341/155, 137, 341/160; 340/347; 359/96, 27, 315, 316; 280/214, 216; 372/38

(56) References Cited

U.S. PATENT DOCUMENTS

| | | | |
|---|---|---|---|
| 4,185,274 | * | 1/1980 | Gialloirenzi .......................... 340/347 |
| 4,395,702 | * | 7/1983 | Gottlieb et al. ...................... 340/347 |
| 4,851,840 | * | 7/1989 | Mc Aulay ............................. 341/137 |
| 6,111,530 | * | 8/2000 | Yun ..................................... 341/137 |

* cited by examiner

Primary Examiner—Michael Tokar
Assistant Examiner—Lam T. Mai
(74) Attorney, Agent, or Firm—Nathan O. Jensen; Kyle Eppele

(57) ABSTRACT

An electrooptical scanning analog-to-digital converter for converting an analog voltage signal from a source to its corresponding digital equivalent in accordance with the invention includes a laser providing a beam having an initial position and multiple deflected positions. The voltage signal forms a deflection input to the laser. A first voltage of the voltage signal provides for the initial position of the beam and multiple other voltages of the voltage signal provide for the plurality of deflected positions of the beam. The invention also includes a phototarget array that has a first phototarget mapped to the first voltage of the voltage signal and multiple incremental phototargets each mapped to one of the multiple other voltages of the voltage signal. The first phototarget and the multiple incremental phototargets are arranged along an axis, which may be in one implementation substantially perpendicular to the initial position of the beam. When the beam is deflected from the initial position that illuminates the first phototarget, to one of the multiple deflected positions by one of the multiple voltages of the voltage signal, at least one of the multiple incremental phototargets is illuminated to provide one of multiple illuminated phototarget array values for conversion of the voltage signal to its corresponding digital equivalent.

10 Claims, 4 Drawing Sheets

ELECTROOPTICAL SCANNING ANALOG-TO-DIGITAL CONVERTER

FIELD OF THE INVENTION

The present invention relates to analog-to-digital converters. More specifically, the present invention relates to analog-to-digital converters using electrooptical technology to obtain very high digitizing resolution, sample speed and input bandwidth.

BACKGROUND OF THE INVENTION

Analog-to-digital (A/D) converters of any known or extrapolated technology or architecture possess limitations when utilized for digitizing high frequency signals, which is critical to applications such as radio signal reception, image and sonar processing, and other high frequency signal applications. Typical capacities for current analog-to-digital converters are, for example, 1 Gigasamples per second (Gs/s) with 8 bit resolution and 5 Megasamples per second (Ms/s) with 16 bit resolution. Digitizing high frequency signals can require higher frequency response quantizing circuits, and digitizing wider bandwidth signal spectra can require higher sample speeds (the relationship of sample speed to digitizing bandwidth is well-known to practitioners of the art, and is set by the Nyquist Limit theorem, which dictates that the sample frequency must be at least twice the bandwidth to be digitized). These limitations pose problems with at least some present technology A/D converters.

Therefore, a method for obtaining digitizing resolution (in bits), sample speed and input bandwidth in excess of conventional A/D converters is desired.

SUMMARY OF THE INVENTION

An electrooptical scanning analog-to-digital converter for converting an analog voltage signal from a source to its corresponding digital equivalent in accordance with the invention includes a laser providing a beam having an initial position and multiple deflected positions. The voltage signal forms a deflection input to the laser. A first voltage of the voltage signal provides for the initial position of the beam and multiple other voltages of the voltage signal provide for the plurality of deflected positions of the beam. The invention also includes a phototarget array that has a first phototarget mapped to the first voltage of the voltage signal and multiple incremental phototargets each mapped to one of the multiple other voltages of the voltage signal. In some embodiments, the first phototarget and the multiple incremental phototargets are arranged along an axis substantially perpendicular to the initial position of the beam. When the beam is deflected from the initial position that illuminates the first phototarget, to one of the multiple deflected positions by one of the multiple voltages of the voltage signal, at least one of the multiple incremental phototargets is illuminated to provide one of multiple illuminated phototarget array values for conversion of the voltage signal to its corresponding digital equivalent. Other implementations can utilize two and three dimensional scanning schemes and are therefore not limited to the one dimensional (perpendicular axis) scanning scheme described above.

DETAILED DESCRIPTION OF AN ILLUSTRATIVE EMBODIMENT

Figure 1:
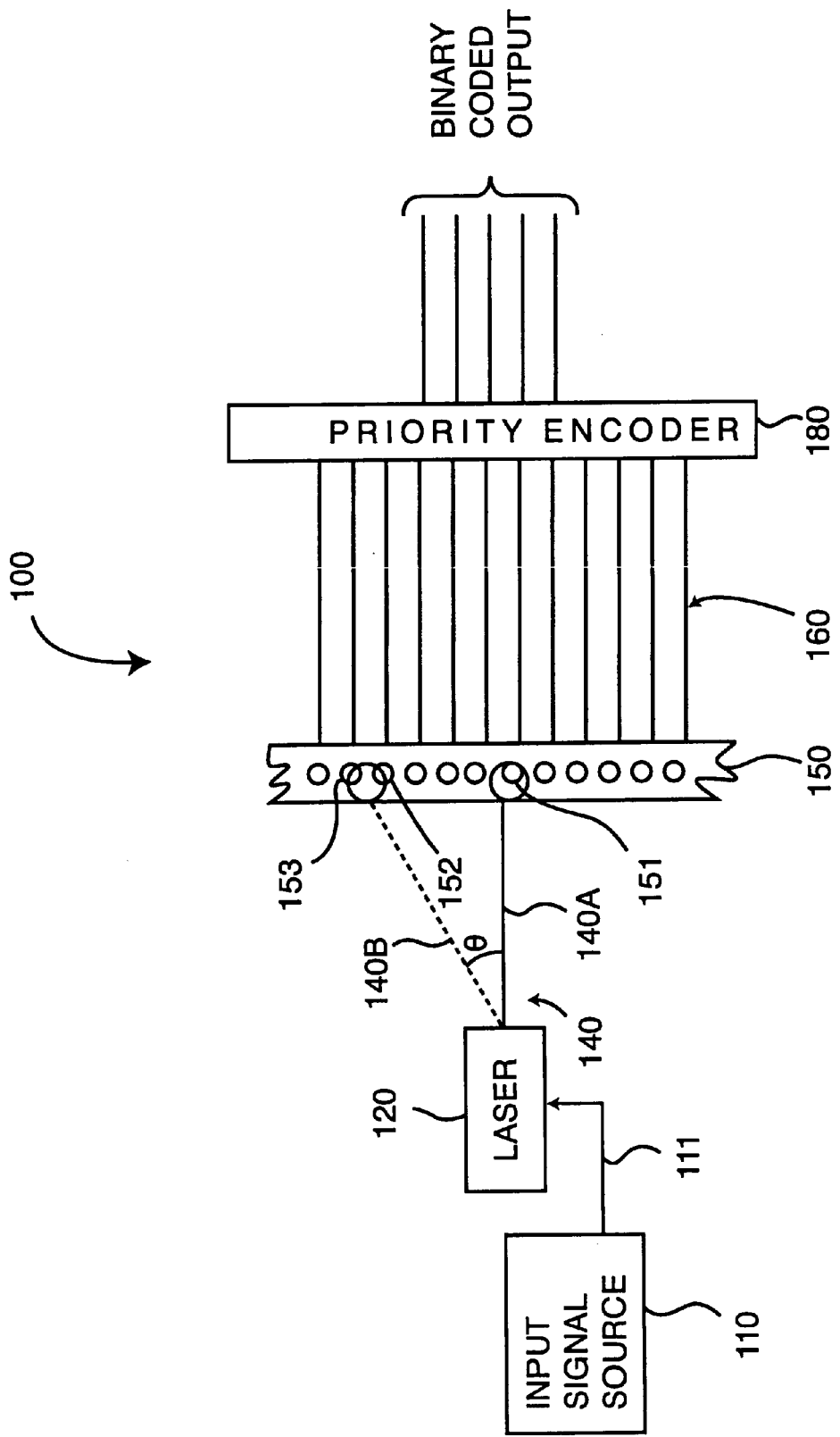
FIG. 1 is a simplified diagram of an electrooptical scanning analog-to-digital converter in accordance with the present invention.

An illustrative embodiment of an electrooptical scanning analog-to-digital converter 100 of the present invention is shown in FIG. 1. The analog-to-digital converter 100 includes a laser 120 (or other suitable scannable narrow-beam optical light source), a phototarget array 150 and optionally a priority encoder 180. Laser 120 can be any of a variety of types of laser. In some embodiments of the invention, laser 120 is a scanning laser and is adapted to be coupled to an input signal source 110 that provides a voltage signal 111 to be digitized. Typically, voltage signal ill will be an analog signal. A beam 140 provided by laser 120 deflects to a deflected position (for example deflected position 140B), at an angle θ relative to the original beam position 140A, in response to the analog voltage signal 111. The amount of deflection (i.e., the value of angle θ) is a function of the amplitude of analog voltage signal 111. Varying amplitudes, or instantaneous voltages of a constant amplitude analog signal, cause beam 140 to occupy different positions (only initial beam position 140A and deflected beam position 140B are shown) at different instants of time. The deflected positions of beam 140 are indicative of the corresponding amplitudes of analog voltage signal 111 at the same time instants.

Analog to digital converter 100 includes phototarget array 150 of multiple phototargets positioned along an axis perpendicular to the laser beam. In other embodiments, the phototargets need not be arranged along an axis perpendicular to the laser beam. For example, two or three dimensional phototarget arrangements are also possible and are considered to be embodiments of the present invention. In FIG. 1, many phototargets are shown in array 150, but for purposes of discussion, only phototargets 151, 152 and 153 are designated with reference numbers. In the initial position 140A, which can correspond to a zero or baseline voltage value of signal 111, beam 140 strikes one or more initial phototargets (for example phototarget 151). In a deflected position such as position 140B, beam 140 strikes one or more different phototargets (such as phototargets 152 and 153).

Figure 4:
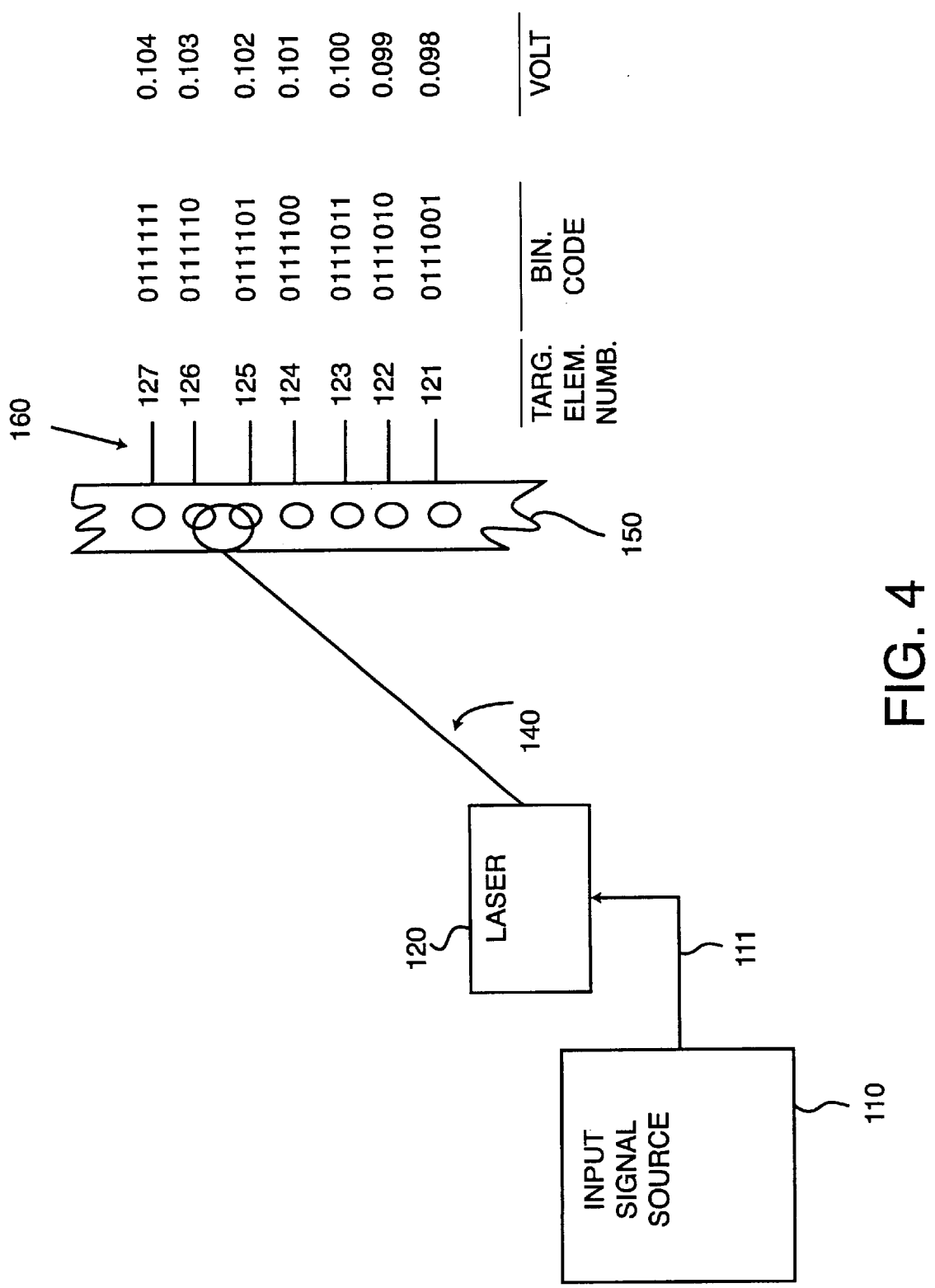
FIG. 4 is a simplified diagram showing a portion of the converter shown in FIG. 1 and diagrammatically illustrating mapping of the individual phototargets to binary codes and to digitized representations of the voltage of the input signal to be digitized.

As illustrated in FIG. 4, the phototargets can be assigned target element or index numbers based upon positions that they occupy along the axis perpendicular to the beam. Each index number has a corresponding binary code and a corresponding voltage amplitude. As laser beam 140 "illuminates" or "energizes" phototargets that are in its path, the phototargets provide an output signal on the corresponding output line or lines 160. An illuminated phototarget at any instant can be mapped to its corresponding index number and/or to the corresponding amplitude of the voltage signal 111. Referring back to FIG. 1, using priority encoder 180 coupled to output lines 160, the index number of the illuminated phototarget can then be encoded or translated into a numeric value, for example, a binary number between 0 and $2^N$, where N represents the binary bits of resolution and $2^N$ is the total number of phototargets. The N bit binary number is then provided at the output of encoder 180. The device is equally functional and usable in those cases where a priority encoding to a binary output format is not needed or desired; this does not alter the apparatus except to omit the priority encoder circuit.

Figure 3:
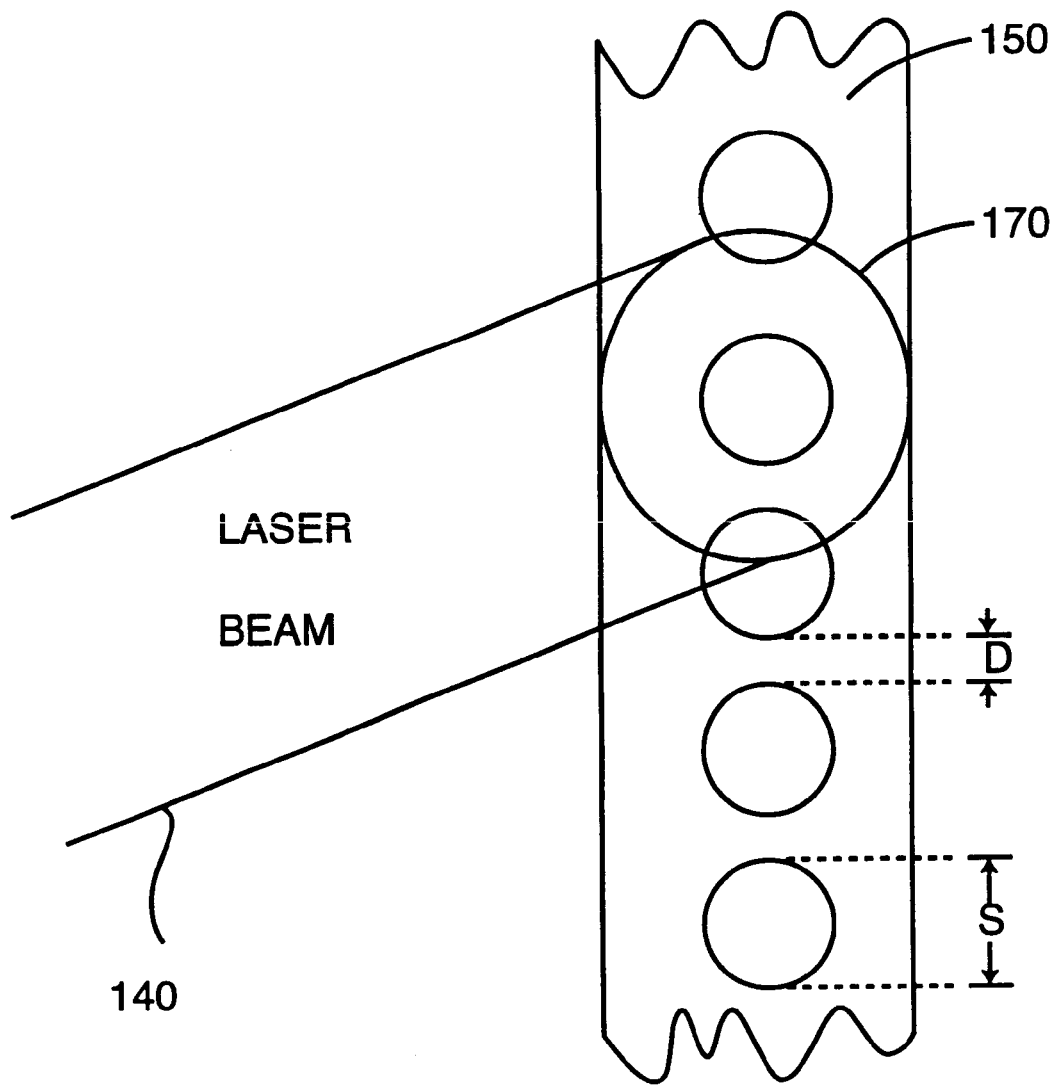
FIG. 3 is a simplified diagram of a portion of a phototarget array illuminated by a laser beam that has a spot size substantially larger than a single phototarget.

Referring now to FIG. 3, an illuminated section of the phototarget array 150 is shown. A phototarget can be a phototransistor or a photodiode that is illuminated or energized by photocurrents, or other devices or elements which generate an output signal in response to energy from a light source such as is provided by laser 120. A spot size 170, which is the area of the phototarget array 150 illuminated by laser beam 140, can be of different sizes. A minimum spot size should in some embodiments be at least greater than the separation distance D between adjacent phototargets along an axis perpendicular to the laser beam. Thus, at least one phototarget would always be energized by laser 120 during operation. Large spot sizes do not necessarily have a negative effect on the accuracy of the analog-to-digital converter, as is discussed below.

If L is the length of the phototarget array along an axis perpendicular to the laser beam and S is the length of a phototarget along the same axis, then in some embodiments L can take the following values (Table 1) for exemplary values of S for 8 and 16 bit analog-to-digital converters respectively.

TABLE 1

| S in $\mu$m | L in mm for an 8 bit analog-to-digital-converter | L in mm for a 16 bit analog-to-digital-converter |
|---|---|---|
| 1 | 0.25 | 65 |
| 0.5 | 0.125 | 33 |
| 0.25 | 0.063 | 16 |

For the different $\mu$m values of S shown in Table 1, spot sizes are likely to be substantially larger, and therefore likely to cause the illumination of more than one phototarget at any one instant of time as shown in FIG. 3. A solution to the apparent problem resulting from the simultaneous illumination of more than one phototarget is provided by priority encoder 180 connected to the output of phototarget array 160. Priority encoder 180 is in some embodiments adapted to operate independent of the spot size or shape, and therefore returns at its output a binary position code corresponding to the highest illuminated phototarget (furthest phototarget from the initial phototarget 151 in some embodiments) of the set of simultaneously illuminated phototargets.

Figure 2:
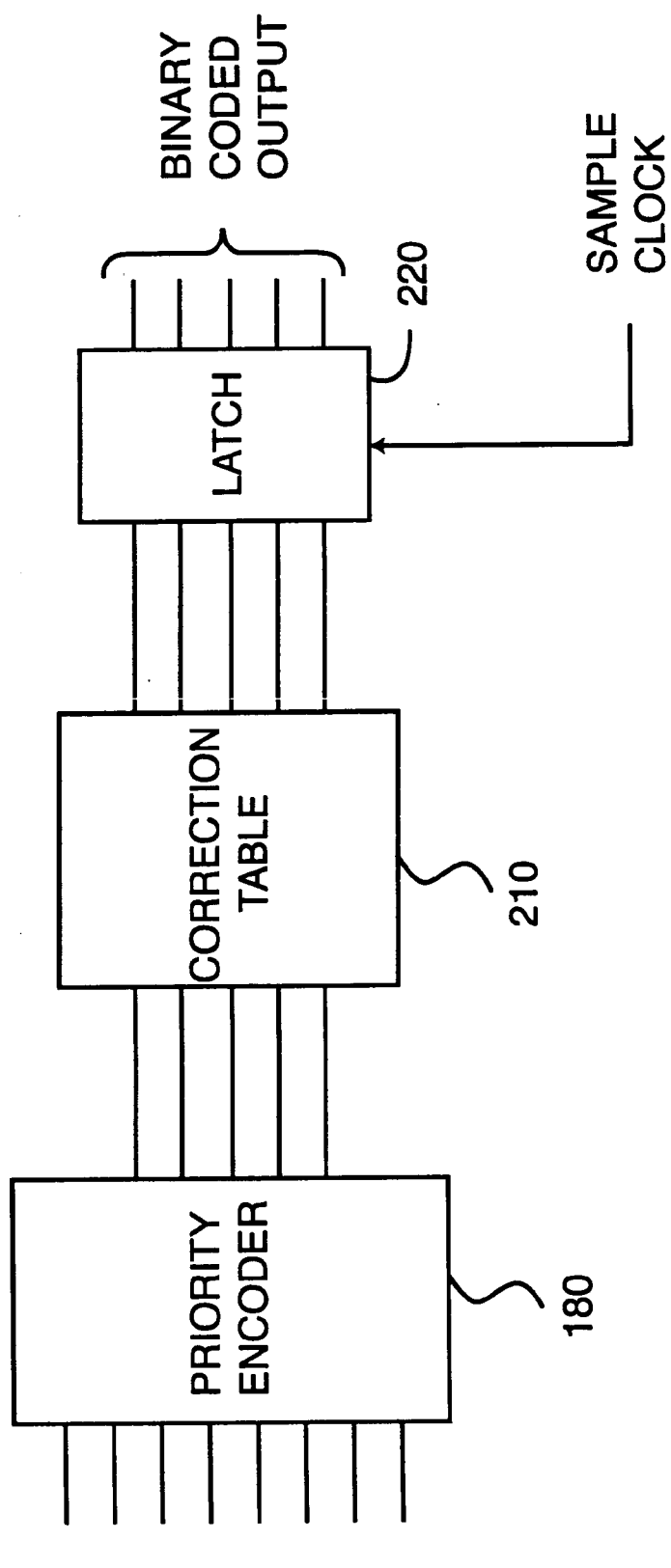
FIG. 2 is a simplified diagram of a portion of the electrooptical scanning analog-to-digital converter in accordance with a more particular embodiment of the invention.

Referring now to FIG. 2, shown are possible additions to the electrooptical analog-to-digital converter of FIG. 1 to include a correction table 210 coupled to the output of priority encoder 180 and a latch 220 operated with the help of sample clock 230. Correction table 210 can be a memory device programmed with a look-up table which correlates the output of priority encoder 180 to a different digital representation of the voltage of signal 111. A traditional sample function is implemented using latch 220 and sample clock 230 which perform constant rate "snapshot" latching of rippling binary output code. Priority encoder 180, phototarget array 150, latch 220, and other components can be integrated onto one integrated circuit for production purposes.

Electrooptical analog-to-digital converters utilizing the inventive concepts can have speeds/bandwidths of between 1 and 10 GHZ or faster with 16–32 bit resolution. Analog-to-digital converters of the present invention utilizing electrooptical technology have digitizing speeds that are limited only by the deflection speed of the laser beam and the target illumination speed. The resolution of the electrooptical analog-to-digital converter is limited only by the realizable size and complexity of the phototarget and the underlying target fabrication processes, as well as the attainable deflection of the laser beam. Also, electrooptical analog-to-digital converters are not limited by the sample and hold requirement of conventional analog-to-digital converters.

In addition, other implementations of the electrooptical analog-to-digital converter can utilize a complex target array which incorporates the priority encoding function directly into the design and geometry of the array, eliminating the need for a separate priority encoder.

Although the present invention has been described with reference to illustrative embodiments, workers skilled in the art will recognize that changes may be made in form and detail without departing from the spirit and scope of the invention.

What is claimed is:

1. An electrooptical scanning analog-to-digital converter for converting a voltage signal from a source to its corresponding digital equivalent, the apparatus comprising:

a laser providing a beam having a plurality of positions including an initial position and a plurality of deflected positions, wherein the voltage signal forms a deflection input to the laser, wherein in response to a first voltage of the voltage signal the laser provides the beam at the initial position, and where in response to each of a plurality of other voltages of the voltage signal the laser provides the beam at corresponding ones of the plurality of deflected positions;

a phototarget array positioned in a path of the beam and having a plurality of phototargets, the plurality of phototargets including a first phototarget positioned in the path of the beam at the initial position and mapped to the first voltage of the voltage signal, the plurality of phototargets also including incrementally spaced phototargets each positioned in the path of the beam at ones of the plurality of deflected positions and mapped to the corresponding ones of the plurality of other voltages of the voltage signal, wherein at least one of the plurality of phototargets currently in the path of the beam provides an output indicative of a current voltage of the voltage signal;

a priority encoder operably coupled to an output of the phototarget array to convert the output to a binary coded output.

2. The electrooptical scanning analog-to-digital converter of claim 1, wherein the plurality of phototargets are incrementally arranged along an axis substantially perpendicular to the initial position of the beam such that during operation at least one of the plurality of phototargets is in the path of the beam and provides an output indicative of a corresponding one of a plurality of phototarget array values for conversion of the voltage signal to its corresponding digital equivalent.

3. The electrooptical scanning analog-to-digital converter of claim 1, wherein the beam has a spot size which is an area of the phototarget array illuminated by the beam, and wherein the spot size is larger than a spacing between adjacent phototargets such that more than one of the plurality of phototargets can simultaneously be in the path of the beam.

4. The electrooptical scanning analog-to-digital converter of claim 3, wherein when more than one phototarget is in the path of the beam, and thus when each of the more than one phototargets in the path of the beam provides an output indicative of different voltages of the voltage signal, the priority encoder is adapted to convert the output, from the phototarget in the path of the beam which has a highest mapped value of the voltage signal, to the binary code.

5. The electrooptical scanning analog-to-digital converter of claim 1, further comprising a digital correction table device operably connected to the priority encoder, the digital correction table device correlating the binary code to a different digital representation of the voltage of the voltage signal.

6. The electrooptical scanning analog-to-digital converter of claim 5, further comprising a latch device adapted to latch an output at a clock rate.

7. A method for converting an analog voltage signal to its corresponding digital equivalent with an electrooptical scanning analog-to-digital converter, wherein the method comprises:

providing a laser beam having a plurality of positions including an initial position and multiple deflected positions, wherein the analog voltage signal forms a deflection input having a plurality of voltage values including a first voltage value that provides for the initial position of the beam and multiple other voltage values that provide for the plurality of deflected positions of the beam;

applying the laser beam to a phototarget array having a plurality of phototargets including a first phototarget mapped to the first voltage value of the analog voltage signal and multiple incremental phototargets each mapped to one of the multiple other voltage values of the analog voltage signal, and wherein the plurality of phototargets are incrementally arranged relative to the initial position of the beam, such that when the beam is in the initial position it illuminates the first phototarget, and when it is deflected to one of the multiple deflected positions by one of the multiple other voltage values of the analog voltage signal at least one of the multiple incremental phototargets is illuminated to provide for selection of one of a plurality of illuminated phototarget array values for conversion of the analog voltage signal to its corresponding digital equivalent;

converting selected ones of the illuminated phototarget array values to a coded output; and wherein providing the laser beam further includes providing the laser beam with a spot size which is larger than a spacing between adjacent phototargets such that the beam may simultaneously illuminate more than one of the plurality of phototargets.

8. The method of claim 7, further comprising converting the coded output to another value indicative of the voltage of the analog voltage signal using a look-up table.

9. The method of claim 8, further comprising latching the converted value at a clock rate to provide digitized signals at the clock rate.

10. The method of claim 7, wherein applying the laser beam to the phototarget array having the plurality of phototargets further comprises applying the laser beam to the phototarget array having the plurality of phototargets with each of the plurality of phototargets comprising a transistor switched by photocurrents.

* * * * *